United States Patent
Yang et al.

(10) Patent No.: US 9,219,963 B2
(45) Date of Patent: Dec. 22, 2015

(54) DUAL SINGLE-CRYSTAL BACKPLATE MICROPHONE SYSTEM AND METHOD OF FABRICATING SAME

(71) Applicant: Invensense, Inc., San Jose, CA (US)

(72) Inventors: Kuang L. Yang, Newton, MA (US); Li Chen, Arlington, MA (US); Thomas D. Chen, Cambridge, MA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/085,307

(22) Filed: Nov. 20, 2013

(65) Prior Publication Data

US 2014/0072152 A1    Mar. 13, 2014

Related U.S. Application Data

(62) Division of application No. 12/870,288, filed on Aug. 27, 2010, now Pat. No. 8,590,136.

(60) Provisional application No. 61/238,014, filed on Aug. 28, 2009.

(51) Int. Cl.
| | | |
|---|---|---|
| *H04R 19/04* | (2006.01) | |
| *H04R 19/00* | (2006.01) | |
| *B81C 1/00* | (2006.01) | |

(52) U.S. Cl.
CPC ............ *H04R 19/04* (2013.01); *B81C 1/00182* (2013.01); *H04R 19/005* (2013.01); *B81B 2201/0257* (2013.01); *B81C 2201/0194* (2013.01); *H04R 2201/003* (2013.01); *Y10T 29/43* (2015.01); *Y10T 29/49002* (2015.01); *Y10T 29/49005* (2015.01); *Y10T 29/4908* (2015.01)

(58) Field of Classification Search
CPC ................. H04R 19/04; H04R 19/005; H04R 2201/003; B81B 2201/0257; B81C 1/00182; B81C 2201/0194
USPC ......... 381/174, 175, 113, 116, 191, 181, 355, 381/369; 257/414–416; 438/53, 48
See application file for complete search history.

(56) References Cited

U.S. PATENT DOCUMENTS

| | | | | |
|---|---|---|---|---|
| 4,042,438 | A * | 8/1977 | Kawakami et al. | 29/886 |
| 4,491,697 | A * | 1/1985 | Tanaka et al. | 381/113 |
| 6,985,597 | B2 * | 1/2006 | Akino | 381/174 |
| 7,825,484 | B2 * | 11/2010 | Martin et al. | 257/415 |
| 7,829,366 | B2 * | 11/2010 | Miller et al. | 438/53 |
| 8,131,006 | B2 * | 3/2012 | Martin | 381/423 |
| 8,368,153 | B2 * | 2/2013 | Huang et al. | 257/416 |
| 8,455,288 | B2 * | 6/2013 | Yang et al. | 438/53 |
| 8,590,136 | B2 * | 11/2013 | Yang et al. | 29/594 |
| 8,664,733 | B2 * | 3/2014 | Rombach | 257/416 |
| 8,841,738 | B2 * | 9/2014 | Harney et al. | 257/416 |
| 8,848,962 | B2 * | 9/2014 | Akino | 381/356 |
| 8,860,154 | B2 * | 10/2014 | Wang | 257/416 |
| 2005/0281419 | A1 * | 12/2005 | Miyazaki et al. | 381/191 |

(Continued)

*Primary Examiner* — Curtis Kuntz
*Assistant Examiner* — Joshua Kaufman
(74) *Attorney, Agent, or Firm* — Maryam Imam; IPxLAW GROUP LLP

(57) ABSTRACT

A dual backplate MEMS microphone system includes a flexible diaphragm sandwiched between two single-crystal silicon backplates. Such a MEMS microphone system may be formed by fabricating each backplate in a separate wafer, and then transferring one backplate from its wafer to the other wafer, to form two separate capacitors with the diaphragm.

11 Claims, 7 Drawing Sheets

(56) References Cited

U.S. PATENT DOCUMENTS

| | | | |
|---|---|---|---|
| 2006/0072770 A1* | 4/2006 | Miyazaki | 381/116 |
| 2007/0165888 A1* | 7/2007 | Weigold | 381/174 |
| 2008/0187154 A1* | 8/2008 | Martin | 381/174 |
| 2009/0218642 A1* | 9/2009 | Miller et al. | 257/416 |
| 2011/0073967 A1* | 3/2011 | Chen et al. | 257/416 |
| 2011/0075865 A1* | 3/2011 | Yang et al. | 381/174 |
| 2013/0044899 A1* | 2/2013 | Barber et al. | 381/113 |
| 2014/0072152 A1* | 3/2014 | Yang et al. | 381/174 |
| 2014/0105428 A1* | 4/2014 | Zoellin et al. | 381/174 |
| 2014/0239352 A1* | 8/2014 | Wang | 257/254 |
| 2014/0264650 A1* | 9/2014 | Liu et al. | 257/416 |
| 2014/0346620 A1* | 11/2014 | Johansen et al. | 257/416 |
| 2015/0125003 A1* | 5/2015 | Wiesbauer et al. | 381/111 |

* cited by examiner

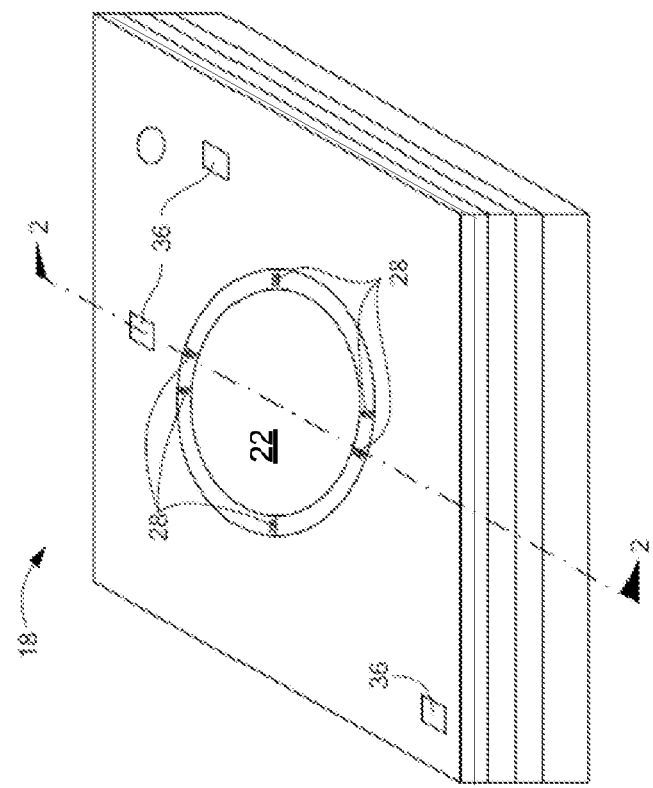
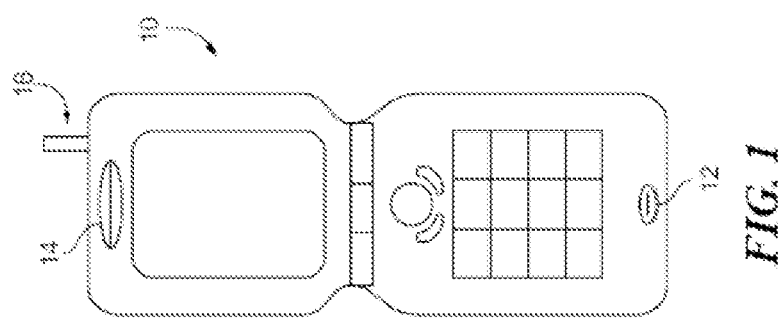
FIG. 2
FIG. 1

DUAL SINGLE-CRYSTAL BACKPLATE MICROPHONE SYSTEM AND METHOD OF FABRICATING SAME

PRIORITY

This application is a divisional application of U.S. patent application Ser. No. 12/870,288, filed on Aug. 27, 2010, by Kuang L. Yang, and entitled "Method Of Fabricating A Dual Single-Crystal Backplate Microphone", which claims priority from provisional U.S. patent application Ser. No. 61/238,014, filed Aug. 28, 2009, entitled, "Dual Single-crystal Backplate Microphone System and Method of Fabricating Same," and naming Kuang L. Yang and Li Chen as inventors, the disclosure of which is incorporated herein, in its entirety, by reference.

TECHNICAL FIELD

The present invention relates to micromachined microphones, and more particularly to methods of fabrication of micromachined microphones.

BACKGROUND ART

Microphones generally have a movable diaphragm arranged parallel to a stationary backplate. The diaphragm and backplate form a variable capacitor. The diaphragm moves in response to incident acoustic energy to change the variable capacitance and thereby produce an electrical signal representative of the incident acoustic energy.

Polysilicon can be micromachined to fabricate both the diaphragm and/or backplate. However, polysilicon micromachined structures may retain stress from their fabrication, and may deform, buckle or even break when cooled. Polysilicon microelectromechanical system ("MEMS") structures may also have surfaces that are not generally planar (i.e., they may be irregularly wavy), which may potentially adversely effect their qualities as the plate of a variable capacitor.

SUMMARY OF THE ILLUSTRATIVE EMBODIMENTS

In a first embodiment, a dual-backplate micromachined microphone has a diaphragm movably sandwiched between two single-crystal backplates to form two variable capacitors—one with each backplate. Two insulative layers, such as oxide layers, electrically isolate the backplates from the diaphragm.

Some embodiments have various contacts in one or both of the backplate layers, to facilitate electrical connections to the diaphragm and one or both of the backplates. Illustrative embodiments include a backside cavity adjacent to one of the backplate layers, to provide physical support for the microphone, and to provide a path for acoustic energy to reach the diaphragm. In some embodiments, one or both of the backplates are part of a silicon-on-insulator wafer, while the diaphragm may be polysilicon. In some embodiments, one or both backplate layers, or a diaphragm layer, include standoffs to regulate the gap between the backplate and the diaphragm.

A dual-backplate microphone may be fabricated by providing a first wafer with a first conductive single-crystal backplate and a conductive diaphragm, and a second wafer with a second conductive single-crystal backplate, and bonding the second backplate to the first wafer such that the diaphragm is sandwiched between, but electrically isolated from, the first backplate and the second backplate. The diaphragm may thus form coupled capacitors, one with the first backplate and another with the second backplate.

One or both of the backplates may be in a layer of a silicon-on-insulator wafer. In some embodiments, one or both of the backplates or the diaphragm layer may include standoffs. Some embodiments include a removable layer on one or both of the backplates to contact and immobilize the diaphragm during fabrication. In some embodiments, removable layers are ultimately removed to release the diaphragm.

The assembly process may involve transferring the second backplate from the second wafer to the first wafer. In some embodiments, the second wafer also includes a sacrificial (or adhesive) layer and a donor substrate, and the process includes removing the donor substrate and sacrificial layer after the wafers are bonded.

BRIEF DESCRIPTION OF THE DRAWINGS

The foregoing features of the invention will be more readily understood by reference to the following detailed description, taken with reference to the accompanying drawings, in which:

FIG. 1 schematically shows a mobile telephone that may use a MEMS microphone configured in accordance with illustrative embodiments of the invention.

FIG. 2 schematically shows a MEMS microphone that may be configured in accordance with illustrative embodiments of the invention.

DETAILED DESCRIPTION OF ILLUSTRATIVE EMBODIMENTS

In illustrative embodiments, a MEMS microphone is configured to have the detection capability for high maximum sound pressure, broad bandwidth, and provide a decreased risk of pull-down. To those ends, a dual-backplate microphone has a movable diaphragm sandwiched between two single-crystal backplates.

FIG. 1 schematically shows a mobile telephone 10 that can use a microphone configured in accordance with illustrative embodiments. In simplified terms, the telephone 10 has a receiver 12 for receiving an audio signal (e.g., a person's voice), a speaker portion 14 for generating audio signals, and a transponder 16 for transmitting and receiving electromagnetic signals encoding audio signals. During use, a person may speak into the receiver 12, which has a MEMS microphone (FIG. 2, discussed below) that converts the person's voice into an electrical signal. Internal logic (not shown) and the transponder 16 modulate this signal to a remote source, such as to a satellite tower and, ultimately, to another person on another telephone 10.

Figure 3:
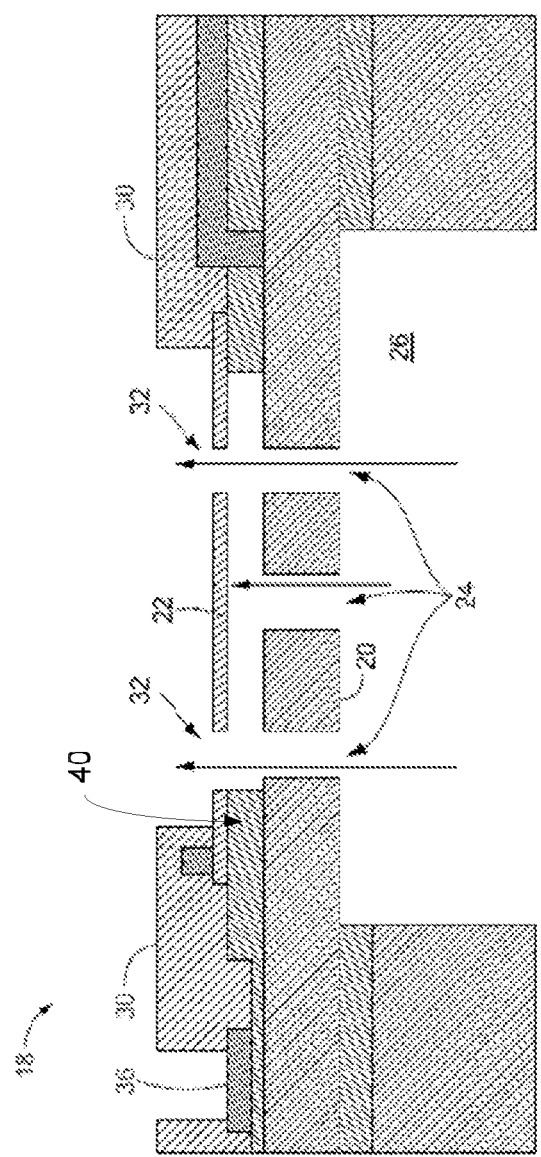
FIG. 3 schematically shows a cross-sectional view of the microphone shown in FIG. 2 across line 2-2.

In illustrative embodiments, the receiver 12 has a microphone mechanically configured with a relatively precise low frequency cutoff point (i.e., the lowest frequency that it can detect without significant distortion—often referred to in the art as the "−3 dB point"). FIG. 2 schematically shows a top, perspective view of a portion of a MEMS microphone 18 (also referred to as a "microphone chip 18"). FIG. 3 schematically shows a cross-sectional view of the same microphone 18 across line 2-2 of FIG. 2. For clarity of illustration, neither FIG. 2 nor FIG. 3 show a second backplate.

Among other things, the microphone 18 includes a static backplate 20 that supports and forms a variable capacitor with a flexible diaphragm 22. In illustrative embodiments, the backplate 20 is formed from single crystal silicon (e.g., the top layer of a silicon-on-insulator wafer, discussed below), while the diaphragm 22 is formed from a deposited material, such as deposited polysilicon. Other embodiments, however, use other types of materials to form the backplate 20 and the diaphragm 22. For example, a single crystal silicon bulk wafer, or some deposited material, may form the backplate 20. In a similar manner, a single crystal silicon bulk wafer, part of a silicon-on-insulator wafer, or some other deposited material may form the diaphragm 22. To facilitate operation, the backplate 20 has a plurality of through-hole apertures ("backplate apertures 24") that lead to a backside cavity 26.

Springs 28 movably connect the diaphragm 22 to a static/stationary portion 40 of the microphone 18, which includes a substrate (also identified by reference number "30"). The springs 28 effectively form a plurality of apertures that permit at least a portion of the acoustic energy to pass through the diaphragm 22. These apertures 32, which also are referred to as "diaphragm apertures 32," may be any reasonable shape, such as in the shape of a slot, round hole, or some irregular shape. Other embodiments, however, may have other types of springs 28 and apertures 24 and 32.

Incident acoustic energy causes the diaphragm 22 to vibrate, thus producing a changing capacitance between it and the backplate 20. Such acoustic energy may contact the microphone 18 from any direction. For example, in FIG. 3, the acoustic energy is shown as traveling upwardly, first through the backplate 20, and then partially through and against the diaphragm 22. In other embodiments, the acoustic energy may travel in the opposite direction. On-chip or off-chip circuitry (not shown) receive (via contacts 36 of FIG. 2) and convert this changing capacitance into electrical signals that can be further processed.

It should be noted that discussion of the specific microphone 18 shown in FIGS. 2-3 is for illustrative purposes only.

Figure 4:
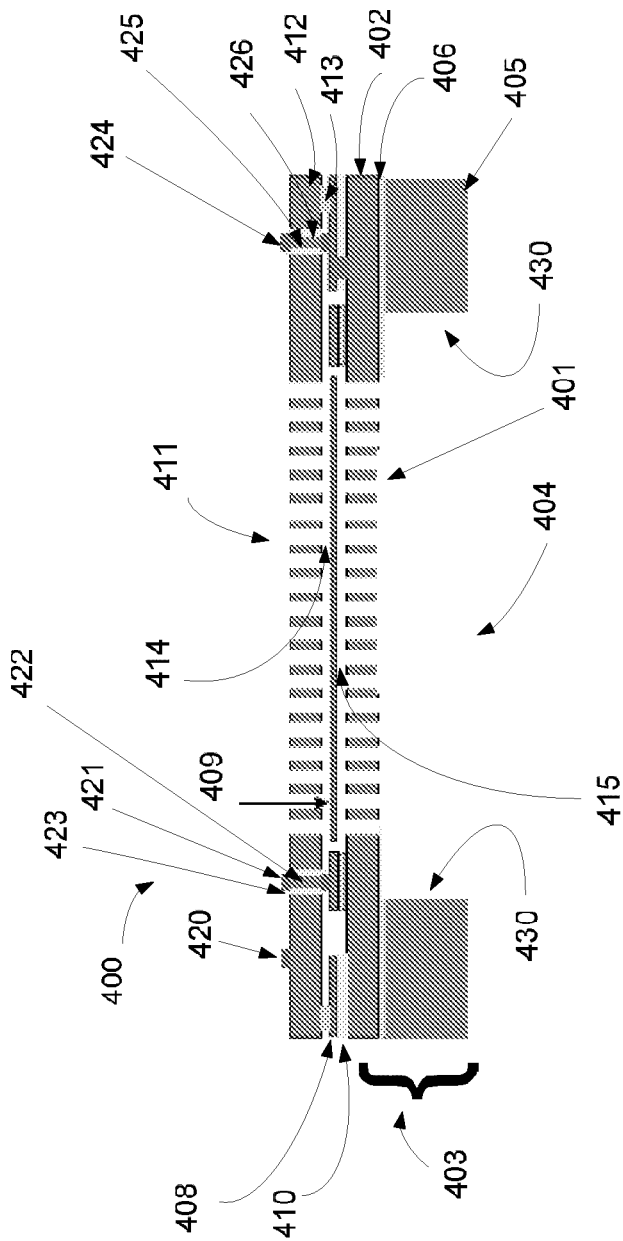
FIG. 4 schematically shows a MEMS microphone system having dual single-crystal backplates according to one embodiment.

In accordance with illustrative embodiments, a dual-backplate microphone 400 has a pair of generally parallel, single-crystal silicon backplate layers 402 and 412, each with a backplate 401 and 411, respectively, and a polysilicon diaphragm layer 408 with a movable, conductive diaphragm 409 sandwiched between the backplate layers 401, 411, as schematically illustrated in FIG. 4. The arrangement of the diaphragm 409 and backplates 401 and 411 might be described as forming a stack.

Generally, a single-crystal backplate will be more rigid, and have a more consistent surface, than a polysilicon backplate. This is in contrast to prior art designs, which have a single backplate, and/or a polysilicon backplate.

The diaphragm 409 forms two capacitors—one with each backplate 401, 411. When incident acoustic energy impinges on the diaphragm 409, the diaphragm moves or vibrates. As the diaphragm moves closer to one backplate, it moves further from the other backplate. Because capacitance is inversely proportional to the gap between the diaphragm and backplate, the capacitance formed by the diaphragm moving towards one back-plate increases, while the capacitance formed by the diaphragm moving away from the other backplate decreases.

When the diaphragm 409 is stationary, the distances between the diaphragm and each of the backplates 401, 411 are determined by other structures within the microphone 400. In FIG. 4, the gap 415 between the diaphragm 409 and the first backplate 401 is determined by the dimensions of bonding media 410, while the gap 414 between the diaphragm 409 and the second backplate 411 is determined by the dimensions of bonding media 413. The rigidity of a single-crystal backplate resists warping of the backplate in response to external forces or impinging acoustic energy, and may thus allow a more consistent gap between the backplates and the diaphragm than other backplates, such as micromachined polysilicon backplates, for example.

Some embodiments include conductive connectors as part of the microphone structure to facilitate electrical connections to the various features of the microphone 400. For example, contact 420 on second backplate layer 412 is electrically coupled to the backplate layer 412 and to the second backplate 411. This allows the second backplate 411 to be electrically connected to other circuits within a microphone system that may, for example, supply power to the backplate 411, or sense the capacitance formed by the backplate 411 and the diaphragm 409.

Another contact 421 coupled to a via 422 passes through the second backplate layer 412 and electrically connects to the diaphragm 409. The via 422 is insulated from the second backplate layer 412 by insulating oxide lining 423.

The first backplate 401 is electrically coupled to yet another contact 424, through via 425 that passes through the second backplate layer 412. The via 425 is insulated from the second backplate layer 412 by insulating oxide lining 426.

The microphone 400 of FIG. 4 also includes a backside cavity 404 through the bottom silicon (handle) layer 405 and intermediate oxide (e.g., the buried oxide, or "BOX") layer 406 of the silicon-on-insulator ("SOI") wafer 403. The backside cavity 404 provides an avenue by which incoming acoustic energy may reach the diaphragm 409, while intermediate oxide 406 acts as an insulator that electrically separates the backplate 401 and the handle layer 405.

The remains 430 of the handle layer 405 provide a structure to support the microphone 400 on a substrate. There is no corresponding structure on second backplate layer 412. Such a corresponding structure would make the microphone 400 taller, and thus occupy more volume, which may be undesirable in some applications (for example, inside a cell phone or IC package, in which space is at a premium).

Fabricating a dual-backplate microphone with single-crystal backplates cannot be accomplished by growing a single-crystal backplate layer in situ adjacent to a diaphragm or another wafer, due to the nature of silicon crystal growth. However, such a microphone may be fabricated by producing at least one of the single-crystal backplates separately, and fabricating the microphone by assembling its component parts by, for example, wafer bonding.

In some embodiments, individually fabricating features on several component wafers (such as two SOI wafers, or an SOI wafer and a single-crystal wafer, for example), and then bonding the wafers together, may be performed prior to the complete fabrication of at least one of the wafers (i.e., when some fabrication steps remain for at least one of the wafers).

Figure 5:
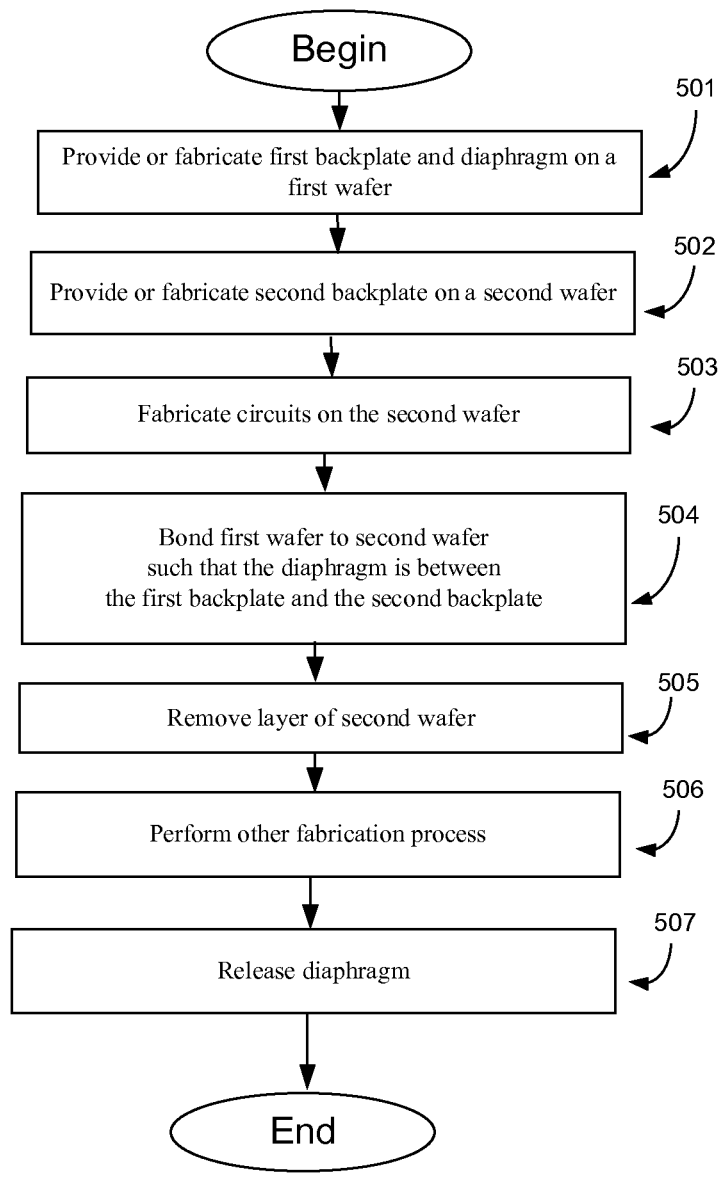
FIG. 5 shows a process of forming a dual-backplate microphone in accordance with illustrative embodiments of the invention.

An illustrative embodiment of such a process is described in the flow chart of FIG. 5. Illustrative embodiments of certain component parts that may be used in the process of FIG. 5 are schematically illustrated in FIGS. 6A, 6B and 6C, and illustrative embodiments of component parts being assembled according to the process of FIG. 5 are illustrated in FIGS. 7A-7E.

The process begins as step 501, in which a first backplate and diaphragm are provided on a first wafer. The first wafer may be an SOI wafer, and the first backplate and the diaphragm may be fabricated in ways known in the art.

Figure 6A:
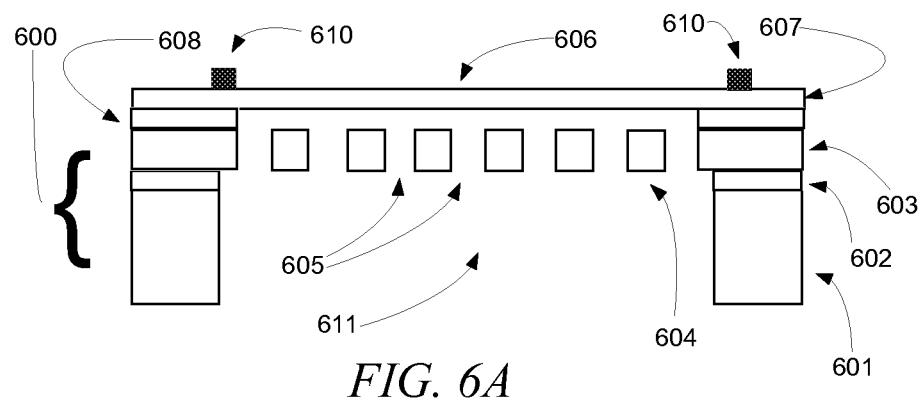
FIGS. 6A-6C schematically illustrate component parts of a microphone according to various embodiments.
Figure 6B:
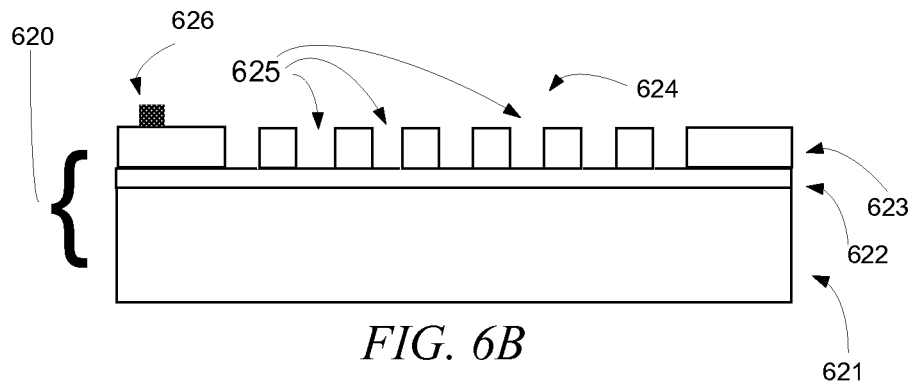
Figure 6C:
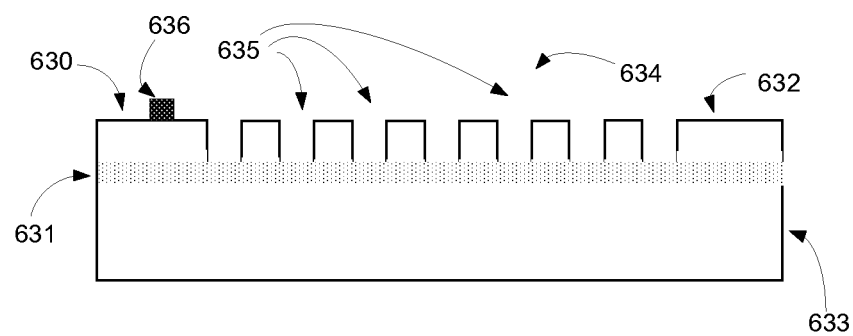

For example, in FIG. 6A the first backplate 604 is schematically illustrated in the device layer (or backplate layer) 603 of SOI wafer 600. The backplate 604 includes one or more holes/apertures/passages 605 that may permit the passage of sound waves or acoustic energy to the diaphragm 606.

The first backplate 604 forms a capacitor with conductive diaphragm 606. To that end, an insulative oxide layer 608 physically and electrically separates the diaphragm layer 607 from the backplate layer 603. The wafer 600 also includes a handle layer 601, and an intermediate oxide layer 602, which include a backside cavity 611.

Figure 7A:
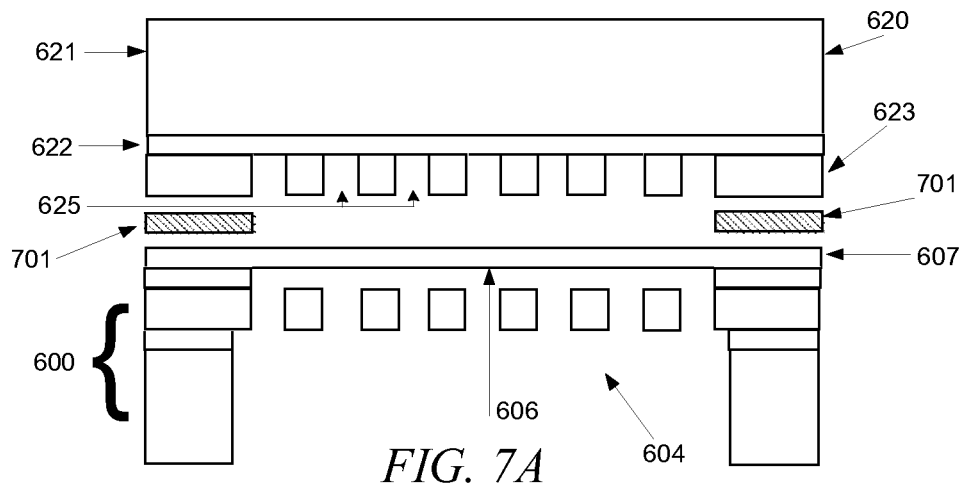
FIGS. 7A-7E schematically illustrate component parts of a microphone according to various stages of fabrication in an illustrative embodiment.
Figure 7B:
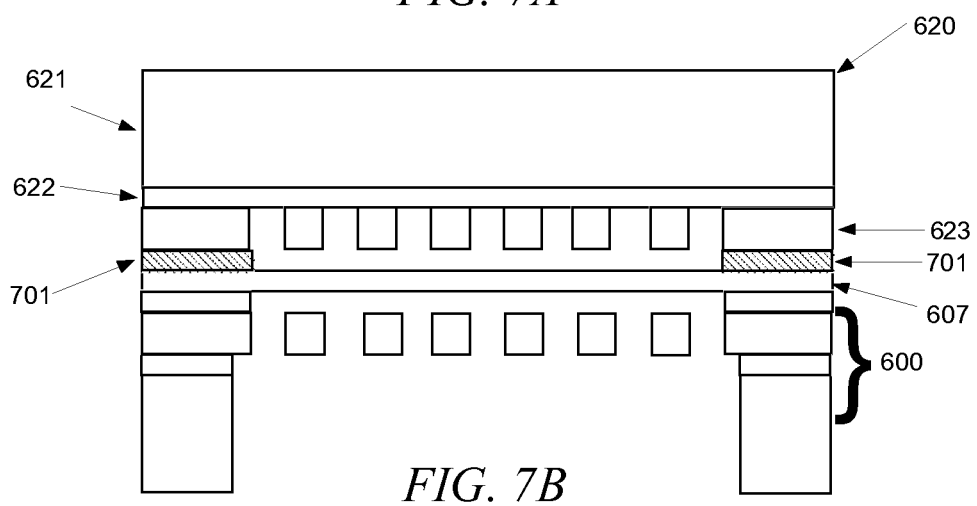
Figure 7C:
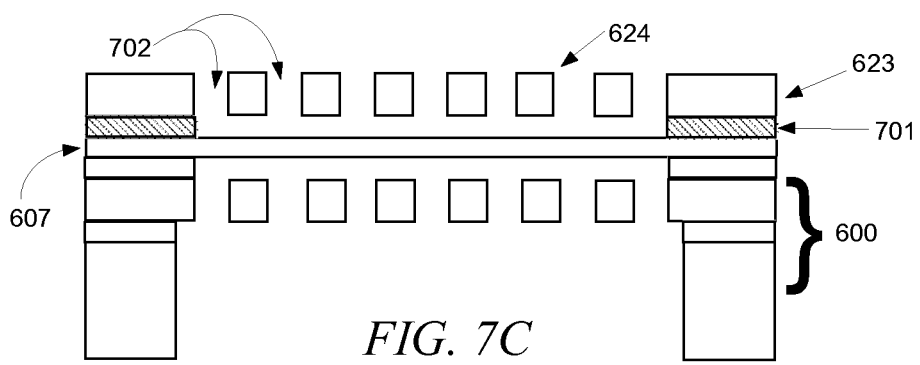
Figure 7D:
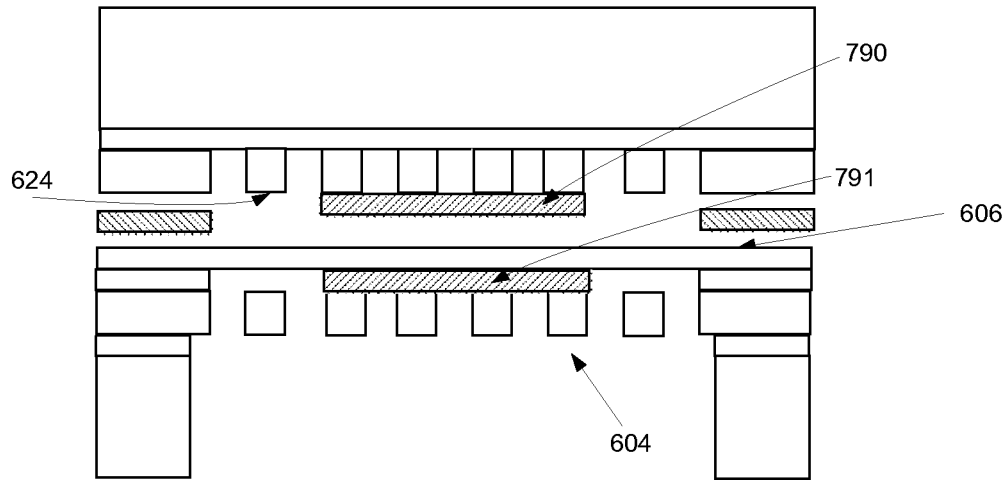

In some embodiments, the diaphragm 606 may be secured to the first wafer 600 by a removable or sacrificial material 791, as schematically illustrated in FIG. 7D. The material 791 may serve to immobilize the diaphragm 606 during subsequent processing. Among other things, this may reduce or eliminate the risk of the diaphragm 606 contacting the backplate 604 during assembly of the dual-backplate microphone. The material 791 may be a sacrificial polysilicon or oxide, for example.

A second backplate is provided on a second wafer (step 502). The second wafer may be known as a "donor" wafer, and it has a "donor" portion that is separable from the second backplate. A backplate illustratively is about 10 microns thick and fabricated from single-crystal silicon.

For example, in FIG. 6B a second wafer 620 includes a second backplate 624 in a device layer (which may also be known as the second backplate layer) 623. The second backplate 624 includes one or more trenches 625 that will later form holes, apertures or passages through the backplate 624. The handle layer 621 is a donor layer (in other words, layer 621 will ultimately donate backplate layer 623 to the dual-backplate microphone being fabricated).

An alternate embodiment of a second wafer is schematically illustrated in FIG. 6C. Wafer 630 includes a damage plane 631 where ions or other impurities have been implanted. In one embodiment, for example, ions (such as hydrogen ions) are implanted below the surface 632 of the wafer 630 to form damage plane 631 parallel to the surface 632.

The top surface 632 includes trenches 635 to partially form backplate 634. The trenches 635 will form apertures through the second backplate 634 after the layer transfer is complete, as discussed below.

As such, the region of the wafer 630 above the damage plane 631 is the second backplate layer. The damage plane 631 and the portion 633 of the second wafer 630 below the damage plane (e.g., on the side of the second wafer 630 opposite the trenches 635) is the donor layer. The donor layer may ultimately be separated from the backplate 624 by fracturing or severing the wafer 630 at the damage plane 631.

Figure 7E:
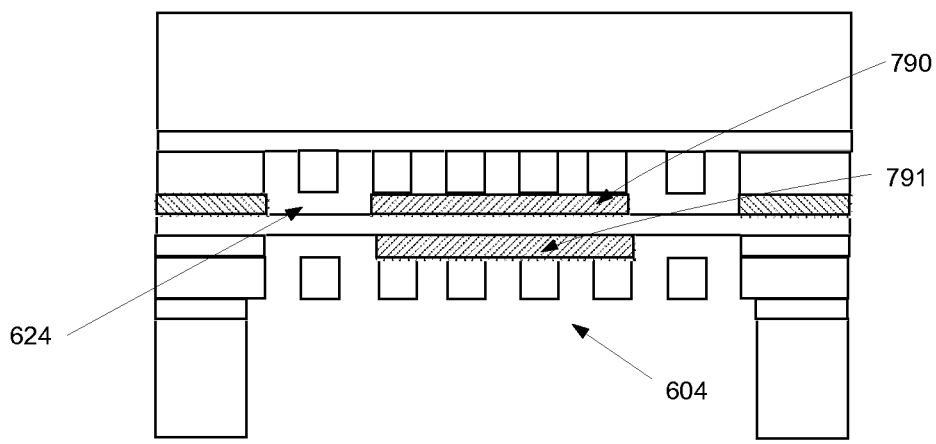

In either case, the second backplate (624 or 634) may have a removable or sacrificial material 790, as schematically illustrated in FIG. 7D. The material 790 may serve to immobilize the diaphragm 606 during subsequent processing as schematically illustrated in FIG. 7E, and may be a sacrificial polysilicon, polymer, or oxide, for example.

In some applications, it may be important that the gap between the diaphragm and the second backplate be substantially the same as the gap between the diaphragm and the first backplate. As such, in some embodiments, one of the second backplate layer or the diaphragm layer, or both, may include one or more non-conductive standoffs, such as standoffs 610 in FIG. 6A, standoff 626 in FIG. 6B, and standoff 636 in FIG. 6C. Such standoffs stand in relief of the face of the surface to which they are attached, and their height should match the gap between the diaphragm and the first backplate. In this way, the standoffs will prevent the gap between the diaphragm and the second backplate from being smaller than desired (e.g., smaller than the gap between the diaphragm and the first backplate). In some embodiments, such a standoff may also serve as a conductor between a contact on the second backplate layer and another member of the microphone, such as the diaphragm or the first backplate.

Optionally, integrated circuits, such as transistors and other active devices, passive devices, and interconnection structures, to name but a few, may be fabricated (step 503) on the second wafer. Fabricating a second backplate or other features of the microphone structure, such as integrated circuits, on the second wafer provides potential benefits that include lower cost of fabrication, and without risk of damage from the fabrication of micromachined structures (such as a diaphragm, for example) on the same substrate. For example, such fabrication can performed at temperatures lower than the dangerously high temperatures at which some micromachined structures are fabricated.

The process then continues to step 504, in which the second wafer is placed in contact with, and bonded to, the first wafer. FIG. 7A and FIG. 7B schematically illustrative step 504 using certain component parts illustrated in FIGS. 6A and 6B. Although this illustrative embodiment employs SOI wafers, it should be noted that various embodiments are not limited to the use of SOI wafers. For example, single-crystal (non-SOI) wafers, such as the second wafer schematically illustrated in FIG. 6C, could also be used.

A first wafer 600 with a first backplate 604 and diaphragm 606 in diaphragm layer 607, and a second wafer 620 with a second backplate layer 623, are provided and arranged so that the second backplate layer 623 faces the diaphragm layer 607, as schematically illustrated in FIG. 7A. If there are electrical interconnects or vias (such as those illustrated in FIG. 4, for example), the contact points on the second wafer 620 should align with counterpart contacts on the first wafer 600 (for example, the contacts may be on diaphragm layer 607).

One or more interconnect materials 701 are placed in-between the first wafer 600 and second wafer 620. The interconnect materials 701 may be adhesive or other conductive or non-conductive bonding material. The interconnect material 701 may be initially attached to one of the first wafer 600, the second wafer 620, or both. In some embodiments, the interconnect materials 701 may initially be on the diaphragm layer 607 and extend across the diaphragm 606 and between the diaphragm 606 and the second backplate 624 to act as a sacrificial material 790, as discussed above, and illustrated in FIG. 7E.

In any case, the interconnect materials 701 are laterally spaced from the diaphragm 606 so as to avoid interfering with the movement of the diaphragm 606 in the finished product (for example, as in FIG. 7C).

The two wafers 600 and 620 and the interconnect materials 701 are then brought together and bonded to each other, to form a unified member as illustrated in FIG. 7B. As such, the two wafers are bonded via the interconnect materials 701. In alternate embodiments, the bonding may be done without inserting bonding materials, for example with metal bonds, or oxide direct bonding.

In some embodiments, the bond between the wafers is formed at a temperature below that at which a MEMS structure or integrated circuits may be damaged. In some embodiments, the bond is fabricated at temperatures of about 200 to 400 degrees Celsius, for example.

Once the wafers are bonded, portions (e.g., donor portions) of the second wafer are removed (step 505), leaving the second backplate bonded to the first wafer. For example, in FIG. 7C the donor layer 621 and intermediate oxide layer 622 of the second wafer 620 have been removed, leaving the second backplate layer 623 attached to the first wafer 600 (and specifically in this embodiment, to diaphragm layer 607). As such, the former trenches 635 perforate (e.g., form holes or passages 702 through) the second backplate layer 623 to form backplate 624.

Removing the donor substrate 621 may involve simply removing the intermediate oxide layer 622, thus allowing the donor substrate 621 to fall away. Alternately, the donor substrate may be removed by etching, grinding, or other methods known in the art.

Still other embodiments may remove portions of the second wafer by a combination of etching, and grinding or lapping down the portions to be removed. For example, if the wafer is an SOI wafer (620), the handle layer (621) may be removed by grinding or lapping down, to expose the insulator layer (622), which may then be removed by etching.

In any case, such processes are preferably low temperature process that will not damage MEMS structures or circuits (such as CMOS circuits) in the device.

Some processes leave the donor wafer intact, while others leave it intact but thinner than it was originally. The donor wafer may be reused if it remains thick enough to have a transferable layer fabricated on its face. For example, in some embodiments, a new backplate 624 may be formed on the donor wafer 620 by fabricating a sacrificial layer 622 (such as an oxide layer which may act as an adhesive layer) on the donor wafer 620, and then fabricating or bonding the new backplate 624 onto the sacrificial layer. In some embodiments, the substrate (donor layer) need not be a wafer, per se, but could be any substrate that is capable of supporting the fabrication of a sacrificial layer and backplate layer. As such, illustrative embodiments may refer to a second "wafer," but it is understood that the structure is not limited to wafers or semiconductor wafers.

Other post-processing (step 506) may be performed before the process ends, such as polishing surfaces (e.g., through CMP or a mechanical grind) or interconnecting circuits, for example. At some point, the diaphragm may be released (step 507)—for example, by removing at least some of the removable or sacrificial material (790 and/or 791, if any) or other remaining structure between the diaphragm 606 and one or both of the backplates 604, 624. Some embodiments that include such sacrificial materials may have only one of the sacrificial materials 790 or 791.

Thus, generally speaking, some embodiments of a dual backplate microphone have a first single-crystal backplate, a second single-crystal backplate, and a flexible diaphragm positioned (or sandwiched) between the first and second backplates. The backplates and diaphragm form a stack, and are separated by a small gap. The diaphragm forms two variable capacitors—one with each of the two backplates. Electrical connections to the diaphragm and each backplate allow each capacitance to be sensed by connected circuitry. The backplates are preferably substantially rigid and will not deform in response to any incident acoustic energy.

A dual-backplate microphone may provide a number of advantages over single-backplate microphones, due, for example, to certain physical properties of the single-crystal backplate, such as its rigidity and smooth surface.

Advantages of a dual-backplate microphone system may include wide dynamic range, including relatively high maximum sound pressure (e.g., greater than 120 dB spl; in some embodiments up to 160 dB spl or greater), and broad bandwidth (e.g., greater than 20 kHz; in some embodiments up to 100 kHz or greater), to name but a few. Also, with a differential capacitor, bias voltages may be employed that are higher than those used in single-backplate designs. The electrostatic force that may attract the diaphragm to the backplate on one side of the diaphragm is, to some degree, counterbalanced by an electrostatic force between the diaphragm and the backplate on the opposite side. These competing, offsetting forces reduce the likelihood that the diaphragm will be pulled to one backplate (a phenomenon that may be known as "pulldown") and irretrievably stuck, and thus, higher bias voltages may be applied.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A dual-backplate microphone comprising:
    a first backplate layer comprising a first conductive, single-crystal backplate;
    a second backplate layer comprising a second conductive, single-crystal backplate;
    a conductive diaphragm movably sandwiched between and electrically isolated from the first and second backplates, wherein the backplates and the conductive diaphragm form a stack such that the conductive diaphragm forms a first variable capacitor with the first backplate and a second variable capacitor with the second backplate;
    a first oxide layer physically and electrically separating the conductive diaphragm from the first backplate layer;
    a second oxide layer physically and electrically separating the conductive diaphragm from the second backplate layer;
    a first contact coupled to a first via, the first via configured to pass through the second backplate and electrically connect to the diaphragm, the first via being insulated from the second backplate by the first oxide layer; and
    a second contact coupled to a second via, the second via configured to pass through the second backplate and electrically connect to the first backplate, the second via being insulated from the second backplate by the second oxide layer.

2. A dual-backplate microphone according to claim 1, wherein the second backplate layer further comprising:
    a second backplate contact electrically coupled to the second backplate; and
    a diaphragm contact electrically coupled to the conductive diaphragm.

3. A dual-backplate microphone according to claim 2, wherein the second backplate layer further comprising a first backplate contact electrically coupled to the first backplate.

4. A dual-backplate microphone according to claim 1, wherein the first backplate layer further comprising a first side and a second side, the first side facing the diaphragm, and the second side comprising a backside cavity.

5. A dual-backplate microphone according to claim 1, wherein the second backplate layer further comprises a first side and a second side, the first side facing the conductive diaphragm, and the second side comprises a backside cavity.

6. A dual-backplate microphone according to claim 1, wherein at least one of the first backplate layer and the second backplate layer comprises an SOI wafer.

7. A dual-backplate microphone according to claim 1, wherein the conductive diaphragm, comprises polysilicon.

8. A dual-backplate microphone according to claim 1, further comprising one or more standoffs between the second backplate layer and the conductive diaphragm layer.

9. A dual-backplate microphone according to claim 8, wherein the standoffs stand in relief from the second backplate layer.

10. A dual-backplate microphone according to claim 8, wherein the standoffs stand in relief from the conductive diaphragm.

11. A dual-backplate microphone according to claim 1, further including a pair of springs individually situated on either side of the conductive diaphragm to moveably connect the conductive diaphragm to a stationary portion of the microphone.

* * * * *